(12) United States Patent
Kushnarenko et al.

(10) Patent No.: US 10,305,461 B2
(45) Date of Patent: May 28, 2019

(54) METHODS, CIRCUITS, DEVICES AND SYSTEMS FOR COMPARING SIGNALS

(71) Applicant: CYPRESS SEMICONDUCTOR CORPORATION, San Jose, CA (US)

(72) Inventors: Alexander Kushnarenko, Haifa (IL); Yoram Betser, Mazkeret-Batya (IL)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 15/630,047

(22) Filed: Jun. 22, 2017

(65) Prior Publication Data
US 2018/0131358 A1 May 10, 2018

Related U.S. Application Data

(63) Continuation of application No. 14/284,727, filed on May 22, 2014, now abandoned.

(51) Int. Cl.
*H03K 5/24* (2006.01)
*G11C 7/06* (2006.01)
*G11C 7/08* (2006.01)

(52) U.S. Cl.
CPC ........... *H03K 5/2472* (2013.01); *G11C 7/065* (2013.01); *G11C 7/08* (2013.01); *H03K 5/24* (2013.01); *H03K 5/2481* (2013.01)

(58) Field of Classification Search
CPC ...... H03K 5/2472; H03K 5/24; H03K 5/2481; H03K 5/249; G11C 7/08; G11C 7/065
See application file for complete search history.

(56) References Cited

U.S. PATENT DOCUMENTS

| | | | |
|---|---|---|---|
| 5,539,339 A | 7/1996 | Rens | |
| 5,614,853 A | 3/1997 | Rens | |
| 7,498,850 B2* | 3/2009 | Hendrickson | ............ H03K 5/22 327/307 |
| 8,917,562 B2* | 12/2014 | Wang | ................. G11C 13/0004 365/158 |

OTHER PUBLICATIONS

USPTO Final Rejection for U.S. Appl. No. 14/284,727 dated Mar. 29, 2016, 10 pages.
USPTO Non-Final Rejection for U.S. Appl. No. 14/284,727 dated Jun. 13, 2016, 8 pages.
USPTO Non-Final Rejection for U.S. Appl. No. 14/284,727 dated Dec. 14, 2015, 8 pages.
USPTO Pre-Brief Appeal Conference Decision for U.S. Appl. No. 14/284,727 dated Feb. 22, 2017, 2 pages.
USPTO Restriction Requirement for U.S. Appl. No. 14/284,727 dated Oct. 26, 2015, 9 pages.
USPTO Final Rejection for U.S. Appl. No. 14/284,727 dated Sep. 28, 2016, 9 pages.

* cited by examiner

*Primary Examiner* — Jung Kim

(57) ABSTRACT

Disclosed is a method of comparing two or more signals which may include: for each of the two or more signals, charging to a fixed voltage a compensation capacitor associated with a sense path of the signal, discharging each of the charged capacitors to a threshold voltage of a transistor in its respective sense path and integrating a discharge current from each capacitor with the signal sensed on the respective sense path.

17 Claims, 15 Drawing Sheets

METHODS, CIRCUITS, DEVICES AND SYSTEMS FOR COMPARING SIGNALS

RELATED APPLICATIONS

The present application is a continuation application of U.S. patent application Ser. No. 14/284,727 filed May 22, 2014. The aforementioned application is hereby incorporated herein by reference in its entirety.

FIELD OF THE INVENTION

The present invention relates generally to the field of comparing signals. More specifically, the present invention relates to comparing two or more signals using a sense amplifier.

BACKGROUND

Integrated circuits (IC) may be used in a wide range of designs and products, some integrated circuits may include an Non Volatile Memory (NVM) array. An NVM array may be composed of NVM cells, ancillary circuitry, a controller and additional circuits. The ancillary circuitry may include for example: array controls, address decoding circuits and sense amplifiers (SA) configured to determine a value/level of one or more targeted NVM cell.

Some NVM memory array types may include: floating gate arrays, array of eCT cells, array of MirrorBit cells, charge trapping cells and more.

The NVM cells may be single bit or multi-level storage cells (MLC) and the cells may be programmable to different states, for example in a single bit configuration the cell may be programmable to either an erased (ERS) or programmed (PRG) stage.

According to some embodiments, the NVM cells may be accessed through wordlines (WLs), bitlines (BLs), select lines (SLs) or otherwise. For each operational mode (Programming of cells, Erasing of cells, Reading of cells etc.) the WLs BLs and/or SLs may be activated accordingly. Which WL, which BL and which SL to operate, as well as if to operate them at all and what voltage to supply to them is dependent on the mode algorithm (read algorithm, program algorithm, read algorithm and so on) and the selected addresses, the specific technology being used and more. Some arrays may not include SLs or WLs or otherwise.

Comparators may be utilized in ICs to compare two signals and output a result indicating which of the two signals is greater than the other. Comparators may be used for logic functionality, analog circuits and more.

A sense amplifier (SA), which may also be considered a comparator, may be utilized in conjunction with a memory array to determine a stored value of an NVM cell. A first input to a sense amplifier may be a current/voltage associated with a targeted NVM cell within the array received through a bitline. A second input to a sense amplifier may be a current/voltage associated with a reference cell which in some configurations may be received through a bitline. The SA may compare the two inputs and determine if the targeted cell is in a PGM or ERS state (or otherwise for MLC).

According to some embodiments, a SA may receive and sample an input. In sampled configurations developing/integrated input voltages cannot be compared/accessed. Furthermore, these types of configurations may include passgates on the input line (connected to the BL) to enable the sampling. A passgate on the input line may add noise to the input signal.

Some transistor types which may be used in associated circuitry are Pmos, Nmos, low voltage (lv) Nmos, lv Pmos, high voltage (HV) Nmos and HV Pmos, Zmos, BJT and more. HV transistors/cells may be differentiated from LV transistors/cells by being designed/configured to enable operation in a higher range of voltages across their channel compared to LV cells (for example, between a drain node and a source node of the transistor) and/or across the gate (for example: between their gate and bulk or ground node) and may include a thick oxide region compared to LV devices.

Furthermore, some circuits may use one or more switches for controlling different modes of operation, enabling connection between two points or disconnecting to points of an electrical connection and/or disabling of current from going through the points. Some switches may include, a single Pmos transistor, a signal Nmos transistor, a pass gate or CMOS switch (which may include both Nmos and Pmos transistors). For convention and clarity for the purpose of this description it will be understood that when (s) a switch is described as on or closed it means that two ports of the switch are connected and current may be enabled to run through and (b) a switch is described as off or open it means that two ports of the switch are disconnected and current is not enabled to flow through the ports. A switch may be operated, for example by applying a predetermined voltage to a gate node of at least one transistor included in the switch.

In ICs some global/general supplies may be provided such as ground voltage (GND) which may be zero, VDD which may be a medium voltage used for typical logical circuits, VDDH may also be selectively used to supply a higher voltage. Additional operational voltages may be supply voltages for operating memories or circuits requiring higher voltages (in absolute values) which may be termed supply1, supply1 and the like.

SUMMARY OF THE INVENTION

The present invention includes methods, circuits, devices can systems for comparing signals. According to some embodiments, a method of comparing two or more signals may include: for each of the two or more signals, charging to a fixed voltage a compensation capacitor associated with a sense path of the signal, discharging each of the charged capacitors to a threshold voltage of a transistor in its respective sense path and integrating a discharge current from each capacitor with the signal sensed on the respective sense path.

According to some embodiments, the method may include enabling a cross coupled latch to increase the gain between the two signals and latching the input to create a substantially digital output. The signal sensed on the respective sense path may develop substantially continuously. The sensed signal may develop substantially linearly. The method may include switching a group of switches to a first charging state to enable the charging and switching the group of switches to a second discharging state to enable the discharging. The method may include switching the group of switches to increase the gain and switching the group of switches to enable the latching.

According to some embodiments, a method of comparing two signals using a quadrangular sensing scheme may include: charging first and second offset compensated capacitors, transistor-dependent discharging of the first and second capacitors to threshold voltage of associated respective first and second transistors and simultaneously enabling respective first and second input signals development on respective first and second bit lines, enabling cross coupling of the first and second transistors to enable continuous first and second signal development and increased gain between the first and second input signals and latching of the first and second inputs so that a substantially digital output may be detected. The first and second input signals may develop substantially linearly.

According to some embodiments, a comparator may include: a first branch including a first transistor coupled to a first capacitor which may be selectively charged to a threshold voltage of the first transistor, the first branch may be connectable to a first bit line and may include a second branch cross coupled to the first branch through/via a first and second cross-coupling connection lines, the second branch may include a second transistor coupled to a second capacitor which may be selectively charged to a threshold voltage of the second transistor, the second branch may be connectable to a second bit line and a first set of switches including one or more sets of switches that when in an amplifying state may cause the first and second transistors to amplify a first input on the first bit line and a second input on the second bit line. Each pair of switches may include a first and second switch associated with the first and second branch respectively.

According to some embodiments, a comparator may include at least one pull-down switch that when in a latching state may cause the first branch and the second branch to latch. The first branch may include a first pull-down Nmos transistor and the second branch may include a second pull-down Nmos transistor.

According to some embodiments, a comparator may include at least one pull-up switch that when in a latching state may cause the first branch and the second branch to latch. The first branch may include a first pull-up Pmos transistor and the second branch may include a second pull-up Pmos transistor.

According to some embodiments, the first input and the second input may develop substantially linearly. One or more pairs of switches may be operable in a charging state to charge the first and second capacitors. The one or more pairs of switches may be operable in a discharging state to discharge the first and second capacitors to a threshold voltage of the second transistor. The first input and the first cross coupling connection line may be connected directly. The first capacitor may be connected directly to a gate of the first transistor and selectively connectable indirectly to supply voltages.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
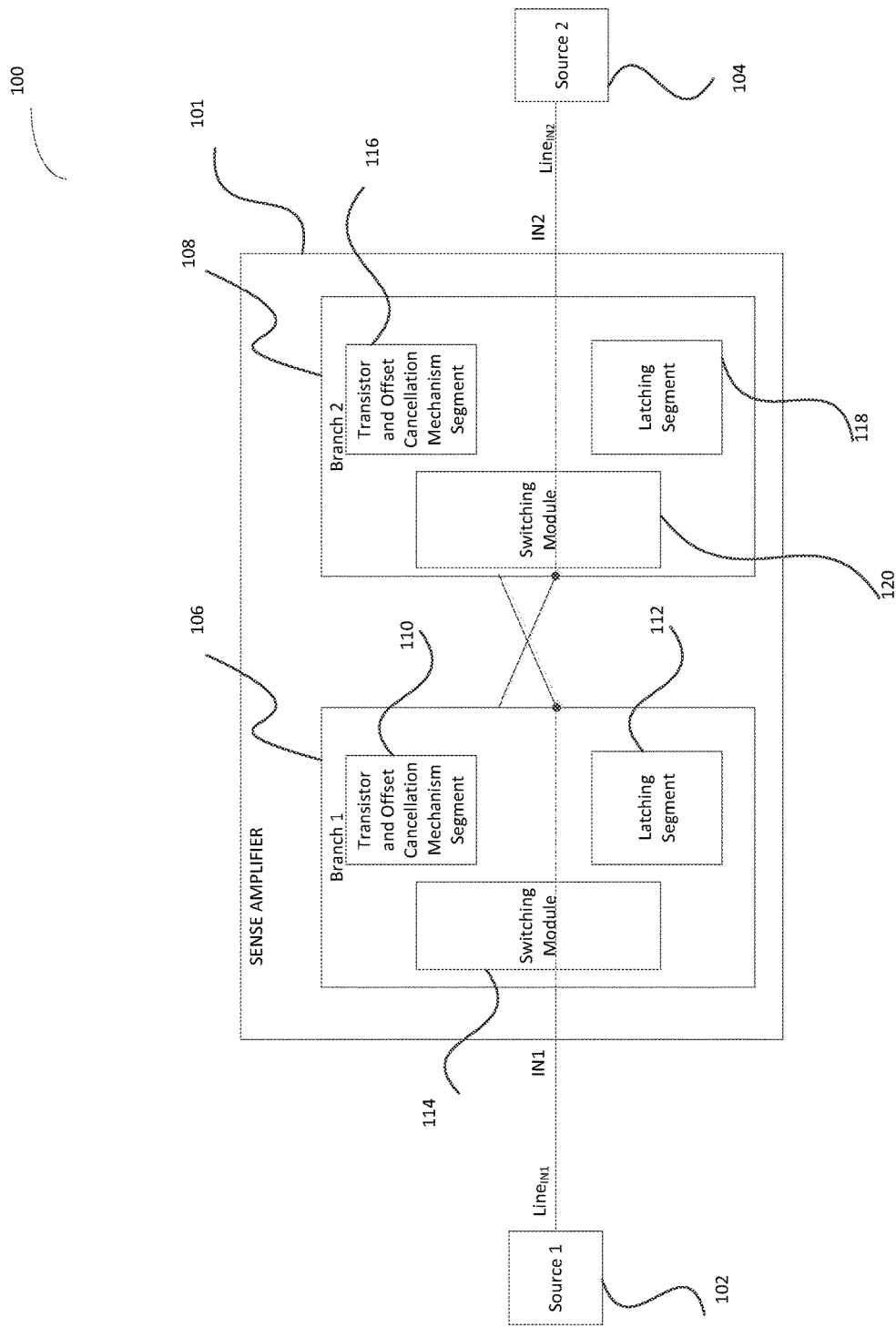
FIG. 1 depicts a block level sense amplifier including connectivity to input sources in accordance with embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification, discussions utilizing terms such as "processing", "computing", "calculating", "determining", or the like, refer to the action and/or processes of a circuit or similar electronic computing device, that manipulate and/or transform data represented as physical, such as electronic, quantities within the circuits elements into other data similarly represented as physical quantities within the circuit's elements.

The processes and displays presented herein are not inherently related to any particular IC or other apparatus.

Unless specifically stated otherwise, as apparent from the following discussions, it is appreciated that throughout the specification discussions utilizing terms such as charging and/or discharging both actions may be interchangeable. Generally, they both refer to changing the amount of electrical charge stored in the capacitor. When either charging or discharging is discussed, it is understood that one may be replaced with the other with appropriate modifications being made where applicable.

For the purposes of this application the term 'respective' or 'respectively' is used to indicate the appropriate corresponding element and to mean 'in the same order'. For example 'a first and second block may be associated with first and second transistors respectively" may also be read: 'A first block may be associated with a first transistor and a second block may be associated with a second transistor'. Similarly, the original sentence may be phrased: 'First and second block may be associated with respective first and second transistors' and have the same meaning as discussed above.

The present invention includes methods, circuits, devices and systems for comparing signals, including signals from Non-Volatile Memory Cells. According to embodiments, there may be provided a circuit for comparing two or more signals, at least one of which may be associated with an NVM cell. The comparing circuit, also referred to as a comparator, may include cross-coupled first and second latching branches, wherein the first branch may include at least a first transistor corresponding to a second transistor on the second branch. Each of these transistors may include a compensation mechanism such as a capacitor to substantially compensate for a mismatched characteristic between the two corresponding transistors. Each compensation capacitor may primarily compensate for a threshold voltage (Vt) deviation/variance of its respective transistor by "match charging" to the Vt of its respective transistor. Match charging may include the steps of (1) fixed charging to a fixed voltage; and (2) transistor dependent discharging, wherein the capacitors discharge path is closed by its respective transistor once the voltage across the capacitor substantially matches a Vt of the respective transistor.

According to some embodiments, a quadrangular-phased sensing scheme may include at least four stages/phases: (a) a first phase (charge stage) to charge offset compensated capacitors coupled to first and second transistors, each of a different branch of a cross-coupled comparator; (b) a second phase (simultaneous stage/signal development/discharge stage) to carry out transistor-dependent discharge and to begin input signal development on the bit line; (c) a third phase (cross-coupled/gain stage) the cross coupling of the two branches may be enabled and the input signal development may be continued, gain between the input signal may be increased; (d) a fourth phase (latch/output stage) to latch the input so that a substantially digital output may be produced/detectable/relayed.

According to some embodiments, the quadrangular phased sensing scheme may be a substantially continuous sensing scheme in that the input received may develop/be integrated over time. The input may develop substantially linearly also during the cross coupled stage. Transition between the sensing scheme stages and control of each stage may at least partially be controlled by a switching module including two or more sets of switches.

Turning to FIG. 1, depicted is a block level diagram 100 including a sense amplifier 101 and its connectivity to input sources such as source1 102 and source2 104 in accordance with some embodiments. Sense amplifier 101 may also be a comparator. Sense amplifier 101 may be configured to compare two input signals such as IN1 and IN2. In an example, during a read operation of an associated memory array in which case source1 and source2 may be NVM cells. Source1 102 and Source2 104 may each provide an input current according to its state. Source1 102 and Source2 104 may be characterized by an extremely low difference between their respective currents; accordingly, a cross-coupled latch may be used to amplify the small differential current to a digital voltage. To further improve the accuracy and speed, an offset cancellation mechanism may be operated/activated.

According to some embodiments, when sense amplifier 101 is used in conjunction with an NVM memory array, a first input (IN1) may be from an NVM cell and a second input (IN2) from one or more reference currents/voltage sources. It is understood that either one of the input sources such as source1 102 and source2 104 may be the NVM cell and/or the reference cell.

According to some embodiments, source1 102 and source 2 104 may be received through a line such as $Line_{IN1}$ and $Line_{IN2}$ which may be an electrical line have a resistance and a capacitance. $Line_{IN1}$ and $Line_{IN2}$ may be BLs, reference lines or otherwise.

According to some embodiments, sense amplifier 101 may include two branches such as branch1 106 and branch2 108. It is understood that sense amplifier 101 may be sensitive to mismatches. Even when branch1 106 and branch 2 108 are designed to be substantially identical, mismatches may occur due to physical differences between the branches stemming from process variations, accuracy level of production and the like. Similarity and/or matching of $Line_{IN1}$ and $Line_{IN2}$ and matching of branch 1106 and branch2 108 are important in order to receive an accurate and quick output to sense amplifier 101.

According to some embodiments, branch1 106 may include a transistor and offset cancellation mechanism segment 110, a latching segment 112 and a switching module 114. Similarly, branch2 108 may include a transistor and offset cancellation segment 116, a latching segment 118 and a switching module 120. A difference between the threshold voltage of the transistor of segment 110 and the transistor of segment 116 may cause a mismatch between branch1 106 and branch2 108. Accordingly, an offset cancellation mechanism is included in segment 110 and segment 116 to cancel/overcome any mismatch between the two transistors due to a difference in threshold values.

According to some embodiments, segment 110 may include a first transistor coupled to a first capacitor to substantially cancel an offset due to the threshold voltage of the first transistor. The capacitor may be selectively charged to a threshold voltage of the first transistor, meaning, that the capacitor is connected to the first transistor and then charged and/or discharged in a controlled manner to equal a threshold voltage of the first transistor Many embodiments may be used to implement the circuitry of segment 110.

According to some embodiments, segment 116 is substantially similar to segment 110 and may include a second transistor coupled to a second capacitor so that the second capacitor is charged to a threshold voltage of the second transistor. Although segment 110 and segment 108 are designed to be substantially identical inherent mismatch due to process inaccuracies may be overcome utilizing the offset cancellation mechanism. Accordingly, branch1 106 and branch2 108 may be substantially matched.

According to some embodiments, branch1 106 and branch 2 108 may each include respective pull-up or pull-down segments such as latching segment 112 and latching 118. Latching segment 112 may include a selective pull down or pull up transistor depending on IN1. The pull down or pull up transistor, when activated may aid in latching of the input and/or output. Latching segment 118 is substantially similar to latching segment 112. It is understood, the IN1 and/or IN2 may also each be outputs.

According to some embodiments, branch1 106 may include one or more switches such as switching module 114. Switching module 114 may include switches which may be embedded and/or distributed throughout branch1 106. The switches of switching module 114 may be operated in arrangement/coordination/concert with each other to control operation of sense amplifier 101. Branch2 108 may also include one or more switches such as switching module 120 which may be substantially similar to switching module 114 of branch1 106. Switching module 120 and switching module 114 may substantially be similar so that maintain matching between branch1 106 and branch2 108 is maintained.

Accordingly pairs of switches (one within switching module 114 and one within switching module 120 may be defined). Where applicable a single switch connected to both branches or within a path of both branches may be used/substituted for a pair of switches so that switching modules 120 and 114 may be at least partially overlapping. Switching module 120 may be operated substantially in orchestra and/or the same as switching module 114. The different switches may change in size and/or type however; preferably, each pair of switches may be of the same type to improve matching between the branches.

According to some embodiments, switching modules 114 and 120 may be configured to cause/enable a first phase/charge stage to enable activation of offset cancellation mechanisms 110 and 116. For example, charging/discharging of an offset capacitor may take place. In conjunction with the first phase, precharging/discharging of a bitline to a predetermined voltage or towards a predetermined voltage (meaning, that the voltage is not necessarily achieved only pulled toward that voltage) may be carried out. A target voltage for a precharging/discharging a bitline may be for example, VDD or GND. Optionally, the charging/discharging of one or more bitlines may be carried out in conjunction with operation of a first phase of the sense amplifier but may be controlled from a different circuit and not dependent/enabled by switching modules 114 and/or 120 and/or operation of the sense amplifier 101.

According to some embodiments, switching modules 114 and 120 may be configured to cause/enable a second phase/simultaneous stage/signal developments stage/discharge stage to occur/take place. For example, a second state of offset cancellation mechanisms 110 and 116 may be enabled so that discharging/charging of an offset capacitor may take place so that the offset mechanisms 110 and 116 reach a steady/operative state. As discussed above regarding charging and discharging, it is understood that the first and second phases discussed the example capacitors of the offset cancellation mechanisms 110 and 116 may be charged to a threshold voltage of a coupled transistor. In some configuration one step may be sufficient to reach the threshold voltage.

According to some embodiments, in conjunction with the second phase, a first and second input signals IN1 and IN2 may be allowed to develop on the respective bitlines $Line_{IN1}$ and $Line_{IN2}$. This step may be carried out irrespective/independent of the state of the switches and as a function of array operation (WL activation, BL select enablement SL or otherwise).

According to some embodiments, switching modules 114 and 120 may be configured to cause/enable a third phase/cross-coupled stage/gain stage to: (a) increase gain between IN1 and IN2 and (b) enable substantially continuous development of IN1 and IN2. IN1 and/or IN2 may be integrated and/or develop linearly. IN1 and/or IN2 may each have two linear segments (for example, during discharge and during gain phases).

According to some embodiments, switching modules 114 and 120 may be configured to cause/enable a fourth phase/latch stage/output stage to latch the first and second inputs and to cause a substantially digital output to be produced. It is understood that IN1 and/or IN2 may each be used as an input as well as an output node. Latching of IN1 and/or IN2 may be at least partially activated utilizing latching segment 112 and/or 118.

According to some embodiments, the two branches branch1 106 and branch2 108 may be cross coupled via first and second cross-coupling connection lines (depicted). The first and second cross coupling connection lines may be directly connected to IN1 and IN2 appropriately. Direct connection may include connections that do not include within the path so that noise on the sensitive inputs is avoided. The direct connection may allow even quicker convergence to output and very fast sensing. The cross coupled connection may further aid/assist and/or partake in the gain development, so that each branch aids in pulling-up/pulling down the other (depending on the input). The cross coupled connection may further aid/assist/partake in the latching of the input IN1 and IN2. As discussed, IN1 and IN2 may also be outputs, so that the outputs may also be latched.

Turning to FIGS. 2A-2E, each depicts a circuit level sense amplifier including connectivity to input sources in accordance with embodiments. FIG. 2A-2E may include a configuration which may be substantially similar to the sense amplifier 101 of FIG. 1 the figures include sense amplifier connectivity to core cells 202 and 204. While specific embodiments are discussed below, additional embodiments are understood and the invention is not limited to the examples detailed below. FIG. 3, which will discussed in conjunction to FIGS. 2A-2E, depicts a signal graph for the switches (SW1-SW6) enablement signals (signal voltage is high, or a digital '1', in these examples indicates switch is on/closed) and the bottom IN graph indicates the input/output nodes CMI_1 and CMI_2. Columns of the graphs show different phases of operation/read cycle.

Figure 2A:
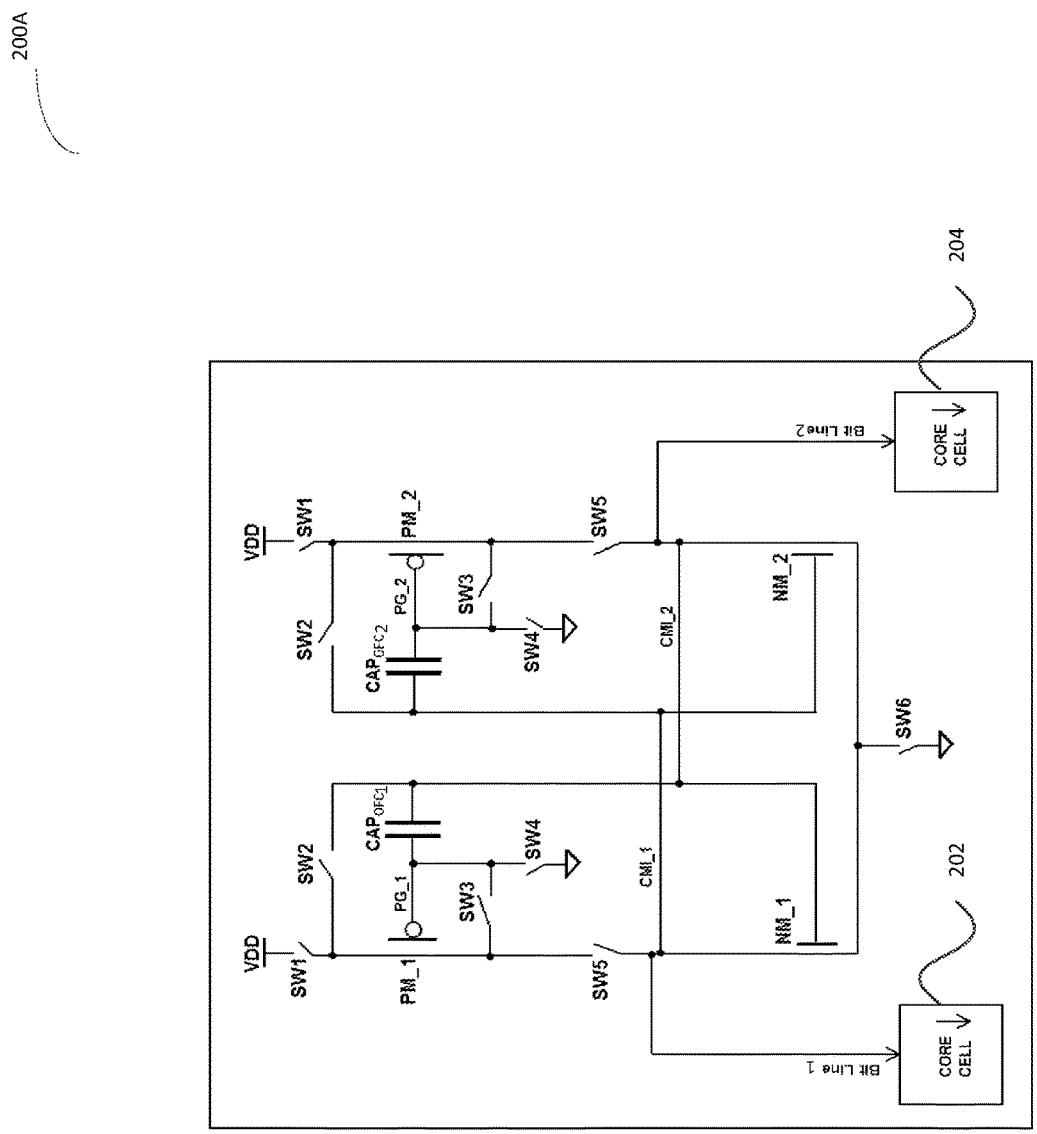
FIGS. 2A-2E each depict a circuit level sense amplifier including connectivity to input sources with changing switch states in accordance with embodiments of the present invention.

FIG. 2A depicts sense amplifier 200A, in a state where all of the switches: SW1-SW6 are in an off/open state. It is understood that FIG. 2A includes the following elements also described with regard to FIG. 1 and description regarding FIG. 1 is relevant to FIG. 2B-2F. Bitline1 and Bitline2 may be substantially similar to $Line_{IN1}$ and $Line_{IN2}$ (respectively) of FIG. 1. Transistor PM_1 and associated capacitor $CAP_{OFC1}$ may be substantially similar to segment 110 and transistor PM_2 and associated capacitor $CAP_{OFC2}$ may be substantially similar to segment 116. Pull down transistors NM_1 and NM_2 may be similar to latching segments 112 and 118 respectively. Cross coupling contention lines CMI_1 and CMI_2 may be substantially similar to the cross coupled lines of FIG. 1. CM1_1 and CMI_2 may be directly connected (i.e. no pass gate switches or switches in general) between them and bitline1 and bitline2 respectively so that VDD and/or GND noise are not injected to the input path, pairs of switches SW1, SW2, SW3, SW4, SW5 and singular switch SW6 may be switching modules 114 and 120 combined as described with regard to FIG. 1. Note that while SW6 is depicted as a singular switch and not a pair of symmetric switches, however it may be replaced with a set of switches. Similarly, where applicable without effecting matching, other switch pairs may be substituted with a single switch. While a specific switch module is described, substitute configurations may be applicable while maintaining operability/functionality of the circuit (sense amplifier 200A).

Figure 2B:
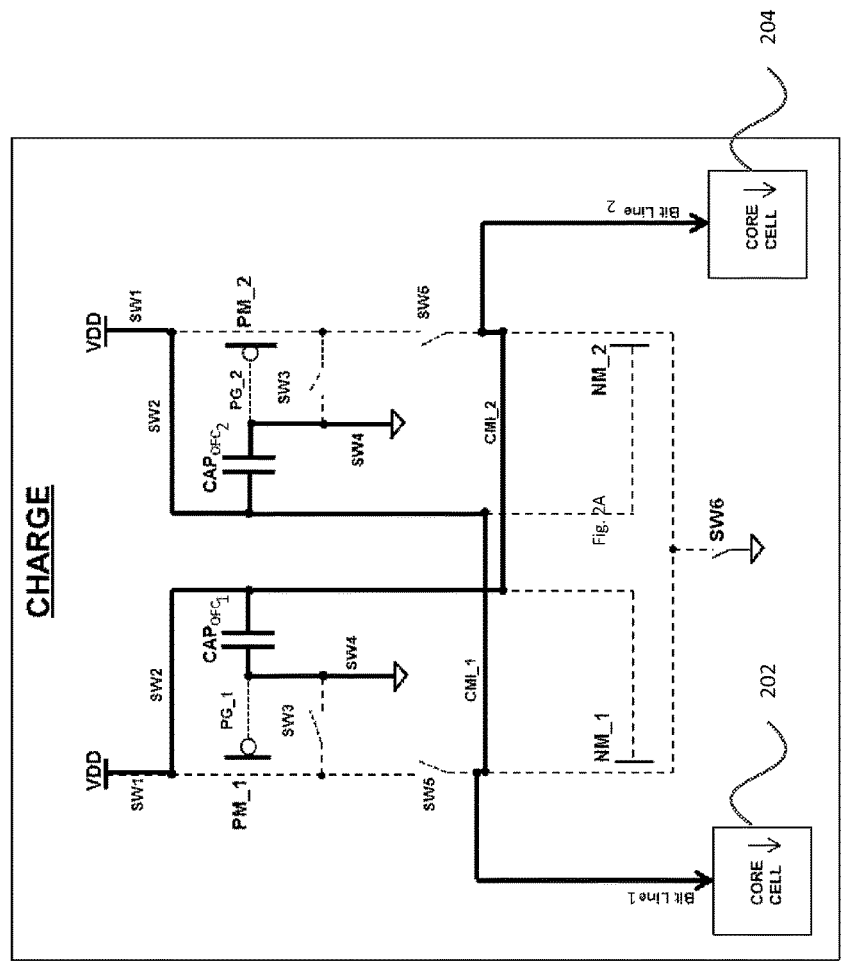
Figure 3:
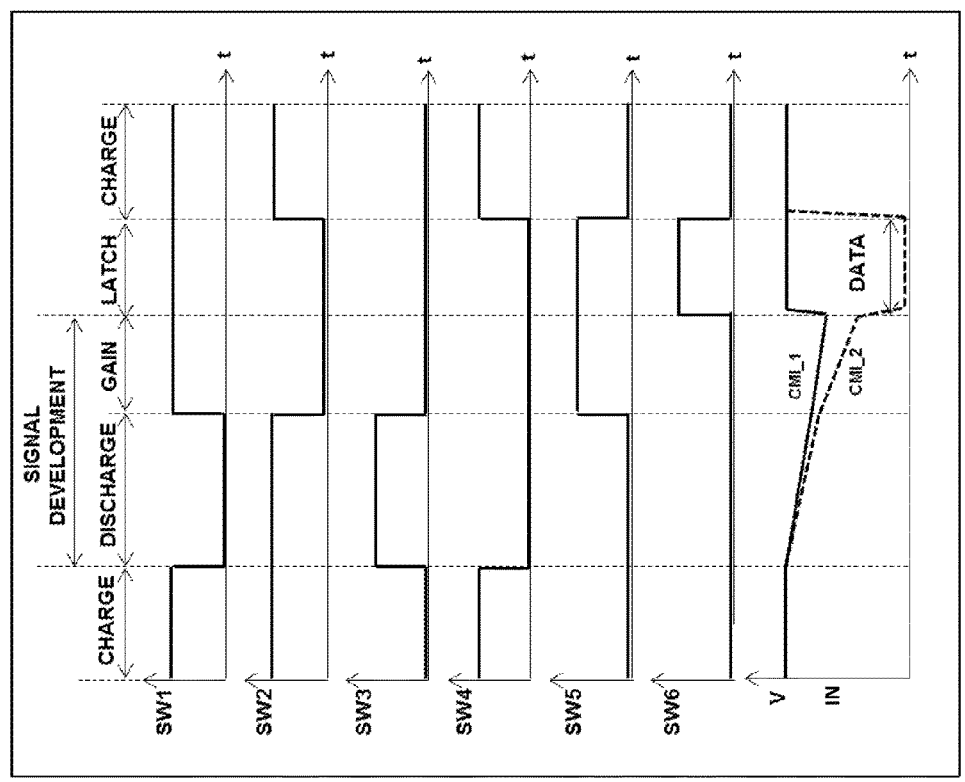
FIG. 3 shows a graphical diagram of switch inputs and the output voltage dependent thereon, in accordance with some embodiments of the present invention.

Turning to FIG. 2B and 'CHARGE' column of FIG. 3 depicted is a sense amplifier 200B substantially similar to sense amplifier 200A, different only in the state of at least some of the switches. In this mode, offset compensated capacitors CAPOFC1 and CAPOFC2 may be charged to VDD level through the closed switches SW1, SW2, SW4. Substantially concurrently (but independent of switching of SW1-SW6) Bitline1 and Bitline2 may be precharged to VDD level, accordingly IN graph shows that both bitlines are charged to VDD. It is understood that the bitlines may be charged through SA 200B, however, additional embodiments in which the bitlines are at least partially precharged from an additional/different/dedicated circuit/source are understood.

Figure 2C:
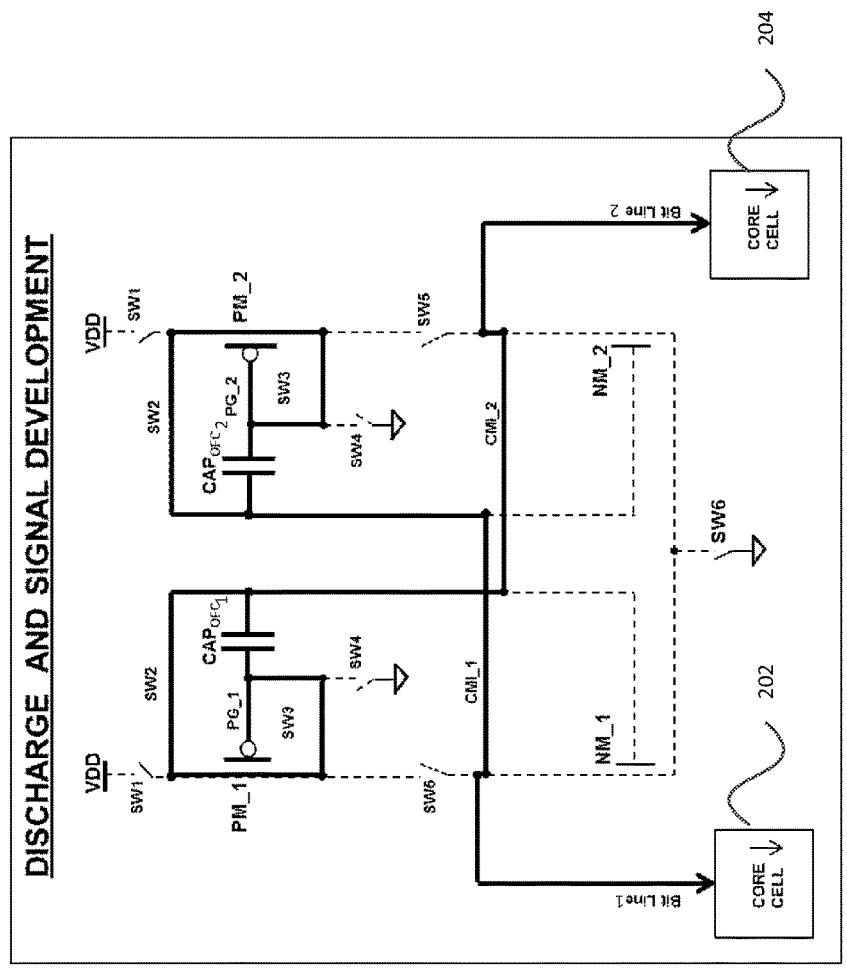

Turning to FIG. 2C and 'DICHARGE' column of FIG. 3 depicted is a sense amplifier 200C substantially similar to sense amplifier 200A, different only in the state of at least some of the switches. In this mode capacitors CAPOFC1 and CAPOFC2 may be discharged to PM_1 and PM_2 threshold level respectively, through the closed switches SW2, SW3 so that transistor-dependent discharging is achieved. Substantially simultaneously with the discharging of the capacitors CAPOFC1 and CAPOFC2, input signal development on bitline1 and bitline2 may be carried out, as well as (i) Core Cell currents discharge, (ii) bit lines capacitance and (iii) SA input capacitance discharged all as depicted by the linear signal of graph IN. It is noted that current due to discharge of $CAP_{OFC1}$ and/or $CAP_{OFC2}$ may be substantially insignificant/negligible to bit line capacitance discharge. According to some embodiments, the length (time) of the discharge stage may be determined by $CAP_{OFC1}$ and/or $CAP_{OFC2}$ discharge time (the longer of the two).

Figure 2D:
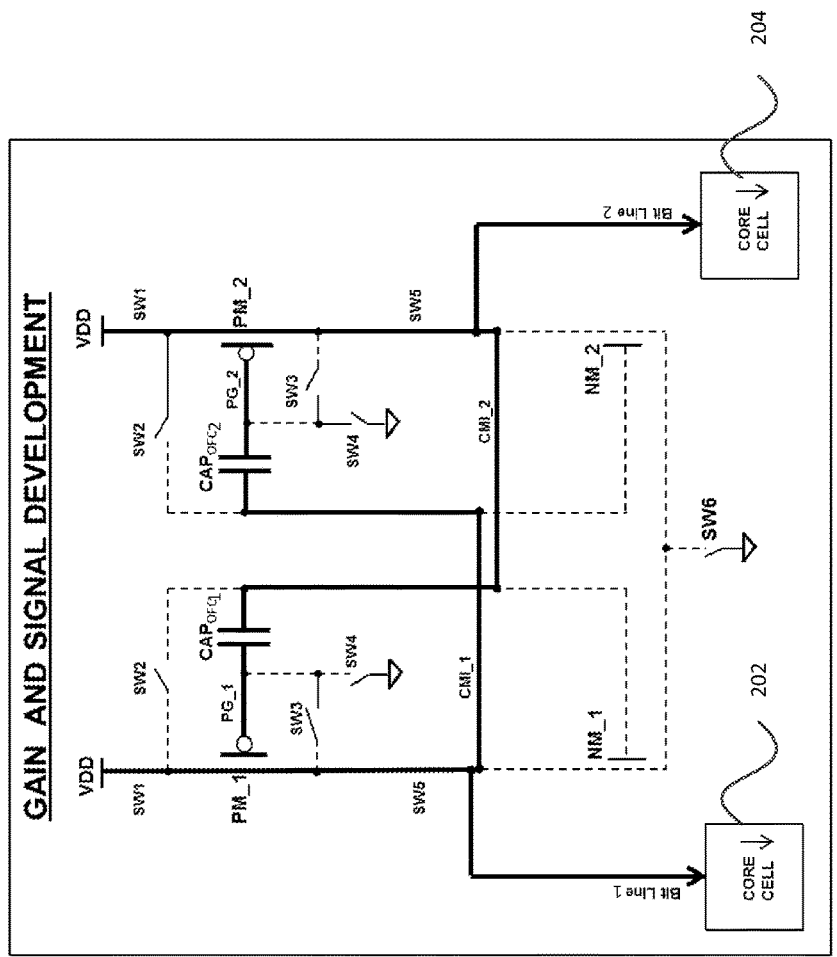

Turning to FIG. 2D and 'GAIN' column of FIG. 3 depicted is a sense amplifier 200D substantially similar to sense amplifier 200A, different only in the state of at least some of the switches. In this mode closed switches SW1, SW5 may activate offset compensated cross coupled PMOS pair (PM_1, PM_2) to amplify SA input voltages (CMI_1, CMI_2).

According to some embodiments, as depicted in FIG. 3 IN graph signal development may be continued (as shown) and may be substantially linear. The second segment (associated with the GAIN column) may be substantially continuous or different than the first segment (associated with the DISCHARGE column) so that the input voltage may be segmented-linear or have a first characterization in the discharge state and a second characterization in the gain stage.

According to some embodiments, sense amplifier 200B and 200C input capacitance may be substantially constant during discharge and gain stages since bitline1 and bitline2 may be continuously connected to $CAP_{OFC1}$ and to the relatively large NMOS transistor NM_1 and to $CAP_{OFC2}$ and to NM_2 (which is equal to NM_1)—which may aid in linear SA input signal CMI_1 and CMI_2 development/integration. The length (time) of the discharge stage may be determined by sense amplifier 200C required sensitivity.

Figure 2E:
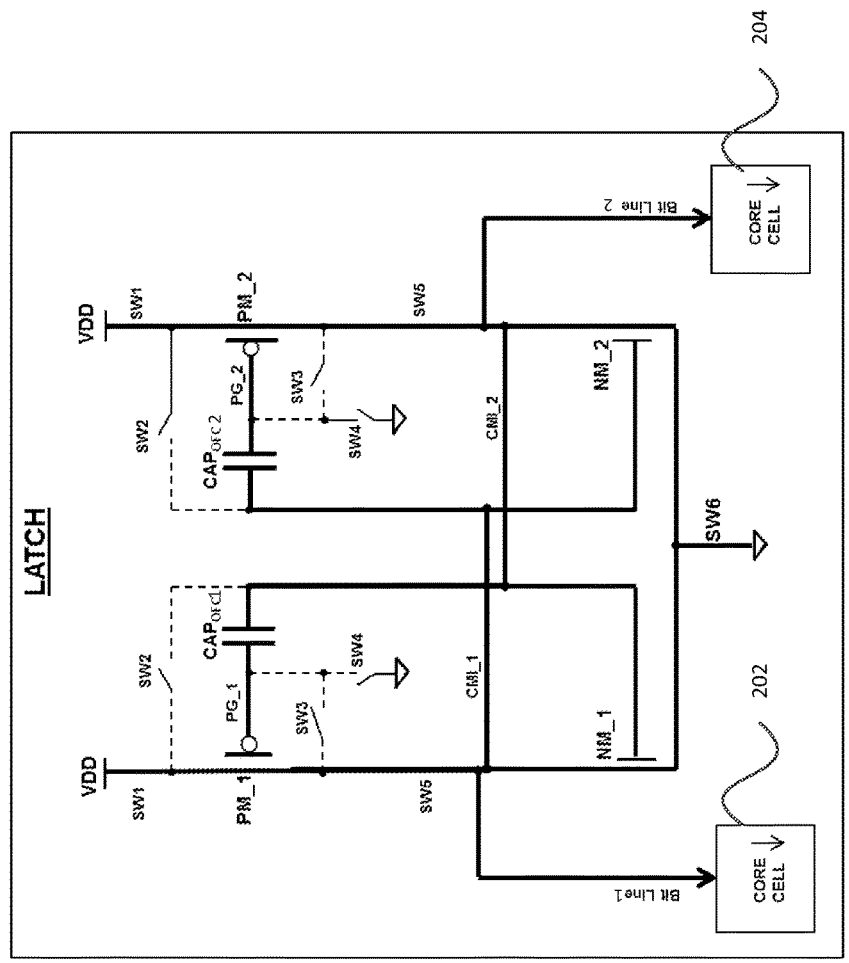

Turning to FIG. 2E and 'LATCH' column of FIG. 3 depicted is a sense amplifier 200E substantially similar to sense amplifier 200A, different only in the state of at least some of the switches. In this mode pull down switch SW6 may couple the NMOS pair (NM_1 and NM_2) to ground and cross coupled latch flips to a digital level. Accordingly, if current of the Core Cell 202 is higher than Core Cell 204, then voltage of the node CMI_1 is coupled to ground and voltage of the node CMI_2 is coupled to VDD. Or vice versa, if current of the Core Cell 202 is lower than Core Cell 204, then voltage of the node CMI_1 is coupled to VDD and voltage of the node CMI_2 is coupled to ground and a digital output signal is achieved. Graph 3 depicts an example where CMI_1 is greater than CMI_2. The length (time) of the latch stage may be determined by length of time it takes the latching to stabilize as well as how long it takes to transfer the latches data to a subsequent data receiver.

Turning to FIG. 4A-4E, each depicts a circuit level sense amplifier including connectivity to input sources in accordance with embodiments. FIG. 4A-4E may include a configuration which may be substantially similar to the sense amplifier 101 of FIG. 1 the figures include sense amplifier connectivity to core cells 402 and 404. While specific embodiments are discussed below, additional embodiments are understood and the invention is not limited to the examples detailed below. FIG. 5, which will discussed in conjunction to FIGS. 4A-4E, depicts a signal graph for the switches (SW1-SW6) enablement signals (signal voltage is high, or a digital '1', in these examples indicates switch is on/closed) and the bottom IN graph indicates the input/output nodes CMI_1 and CMI_2. Columns of the graphs show different phases of operation/1 read cycle.

Figure 4A:
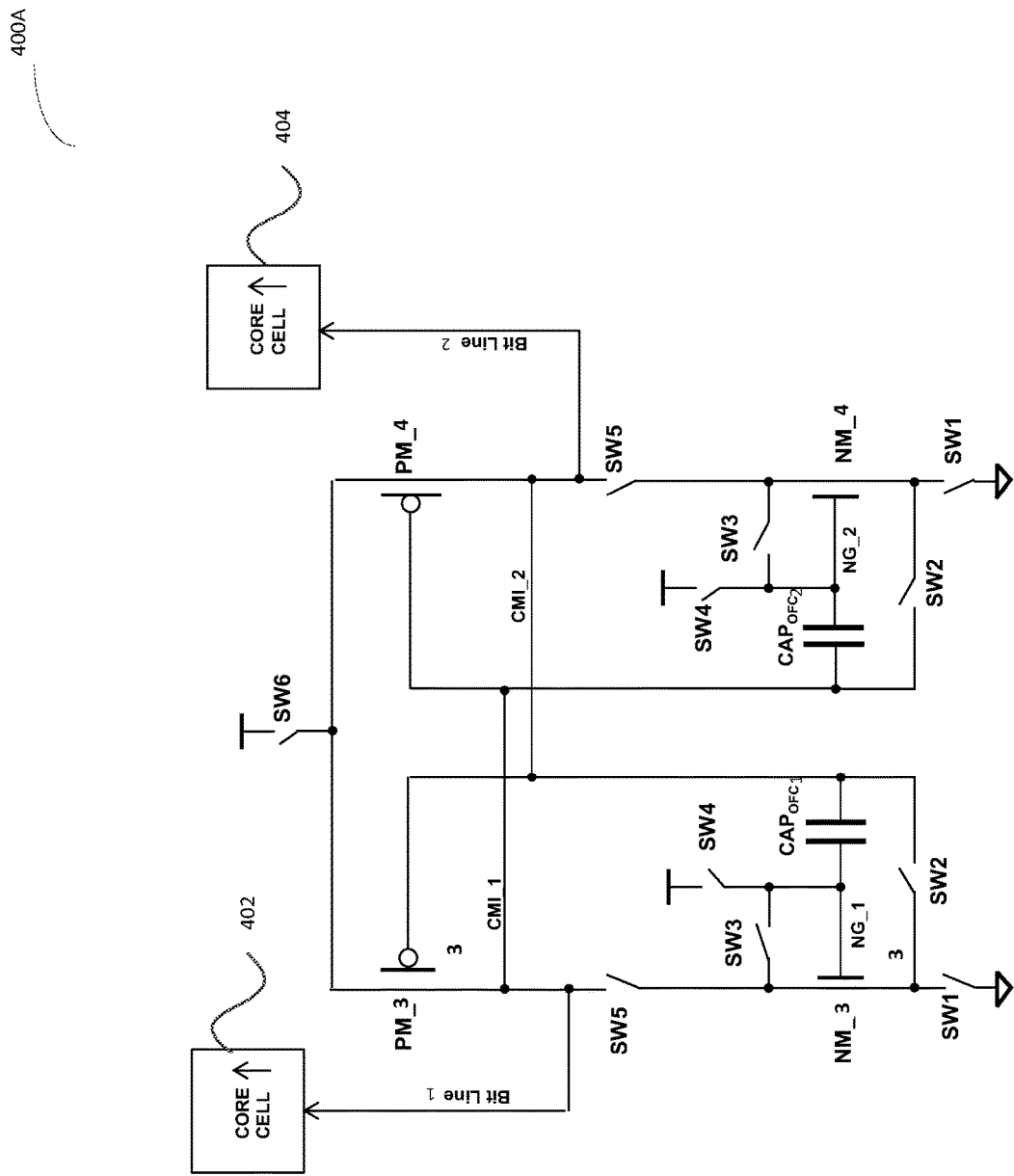
FIG. 4A-4E each depict a circuit level sense amplifier including connectivity to input sources with changing switch states in accordance with embodiments of the present invention.

FIG. 4A depicts sense amplifier 400A, in a state where all of the switches: SW1-SW6 are in an off/open state. It is understood that FIG. 4A includes the following elements also described with regard to FIG. 1 and description regarding FIG. 1 is relevant to FIGS. 4B-4F. Bitline1 and Bitline2 may be substantially similar to $Line_{IN1}$ and $Line_{IN2}$ (respectively) of FIG. 1. Transistor NM_3 and associated capacitor $CAP_{OFC1}$ may be substantially similar to segment 110 and transistor NM_4 and associated capacitor $CAP_{OFC2}$ may be substantially similar to segment 116. Pull up transistors PM_3 and PM_4 may be similar to latching segments 112 and 118 respectively. Cross coupling contention lines CMI_1 and CMI_2 may be substantially similar to the cross coupled lines of FIG. 1. CMI_1 and CMI_2 may be directly connected (i.e. no pass gate switches or switches in general) between them and bitline1 and bitline2 respectively so that VDD and/or GND noise are not injected to the input path, pairs of switches SW1, SW2, SW3, SW4, SW5 and singular switch SW6 may be switching modules 114 and 120 combined as described with regard to FIG. 1. Note that while SW6 is depicted as a singular switch and not a pair of symmetric switches, however it may be replaced with a set of switches. Similarly, where applicable without effecting matching, other switch pairs may be substituted with a single switch. While a specific switch module is described, substitute configurations may be applicable while maintaining operability/functionality of the circuit (sense amplifier 400A).

Figure 4B:
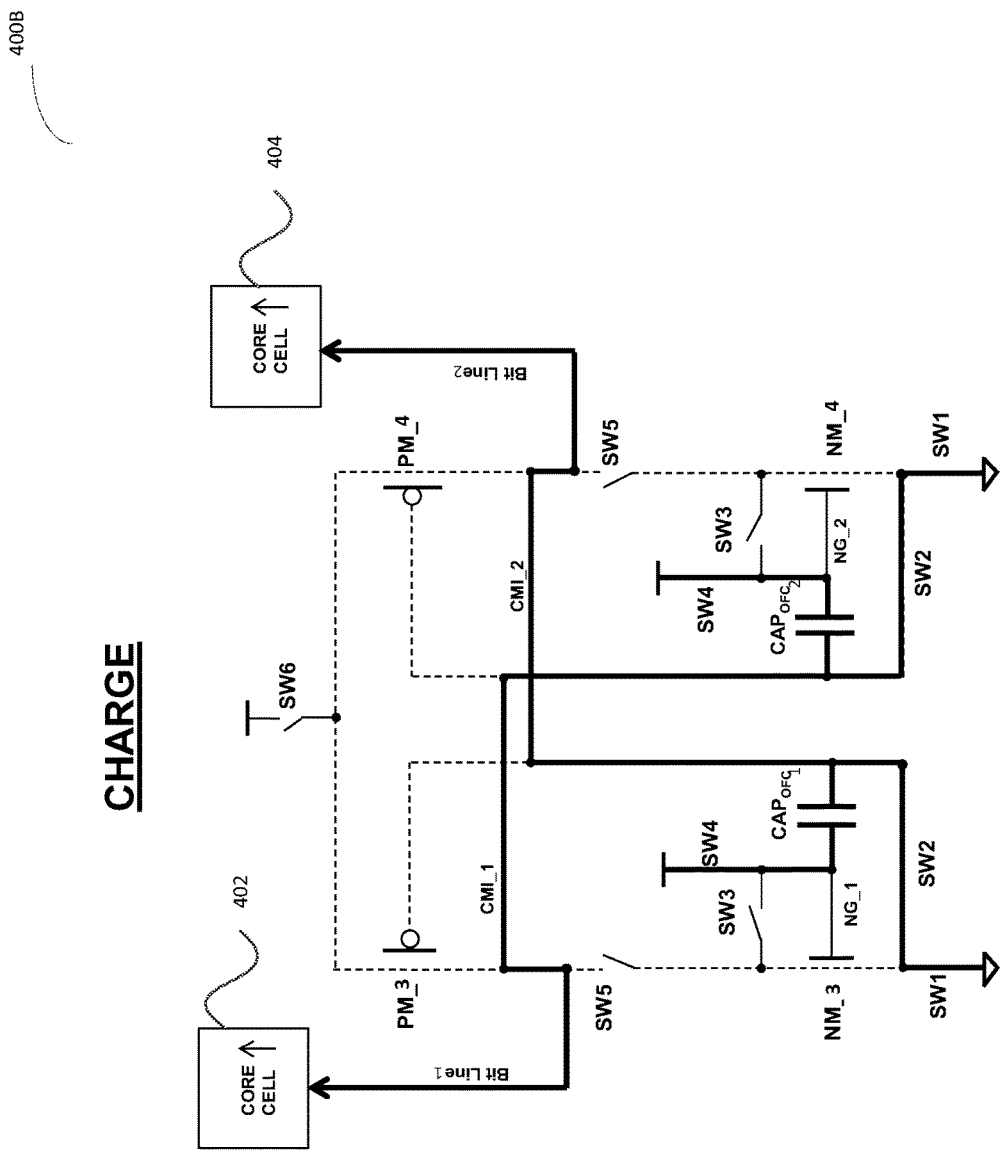
Figure 5:
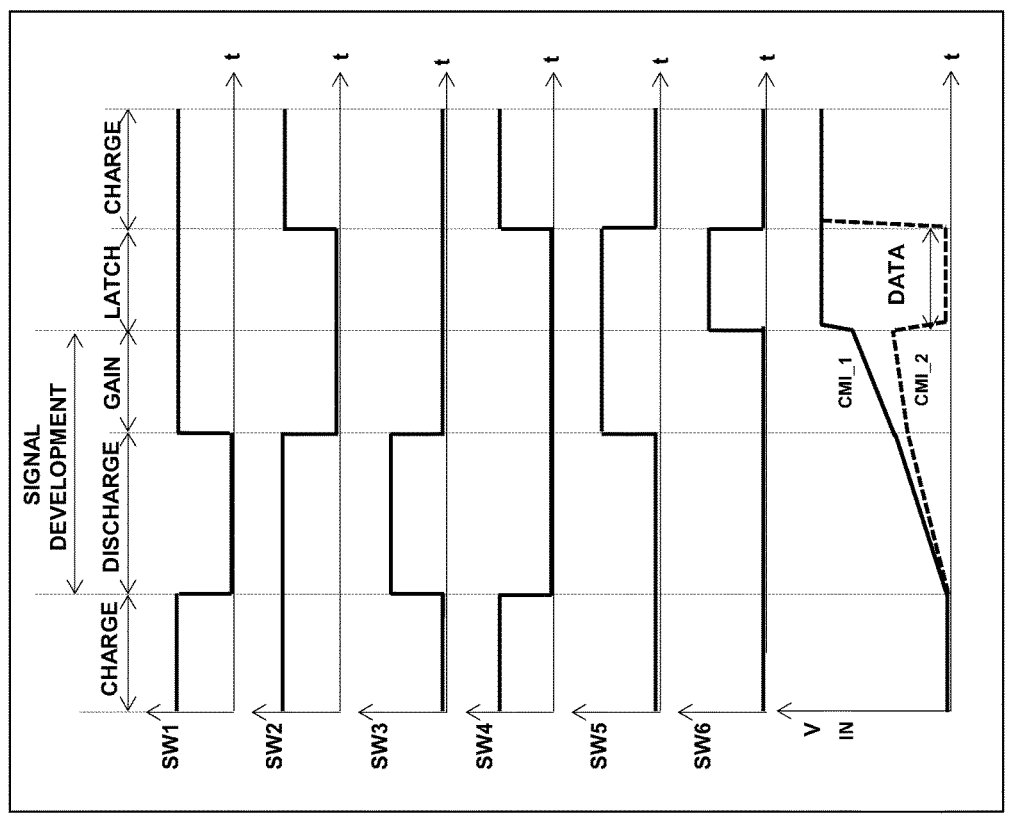
FIG. 5 shows a graphical diagram of switch inputs and the output voltage dependent thereon, in accordance with some embodiments of the present invention.

Turning to FIG. 4B and 'CHARGE' column of FIG. 5 depicted is a sense amplifier 400B substantially similar to sense amplifier 400A, different only in the state of at least some of the switches. In this mode, offset compensated capacitors $CAP_{OFC1}$ and $CAP_{OFC2}$ may be charged to VDD level through the closed switches SW1, SW2, SW4. Substantially concurrently (but independent of switching of SW1-SW6) Bitline1 and Bitline2 may be discharged to GND level accordingly IN graph shows that both bitlines are discharged to GND. It is understood that the bitlines may be discharged through SA 400B, however, additional embodiments in which the bitlines are at least partially discharged from an additional/different/dedicated circuit/ground source are understood.

Figure 4C:
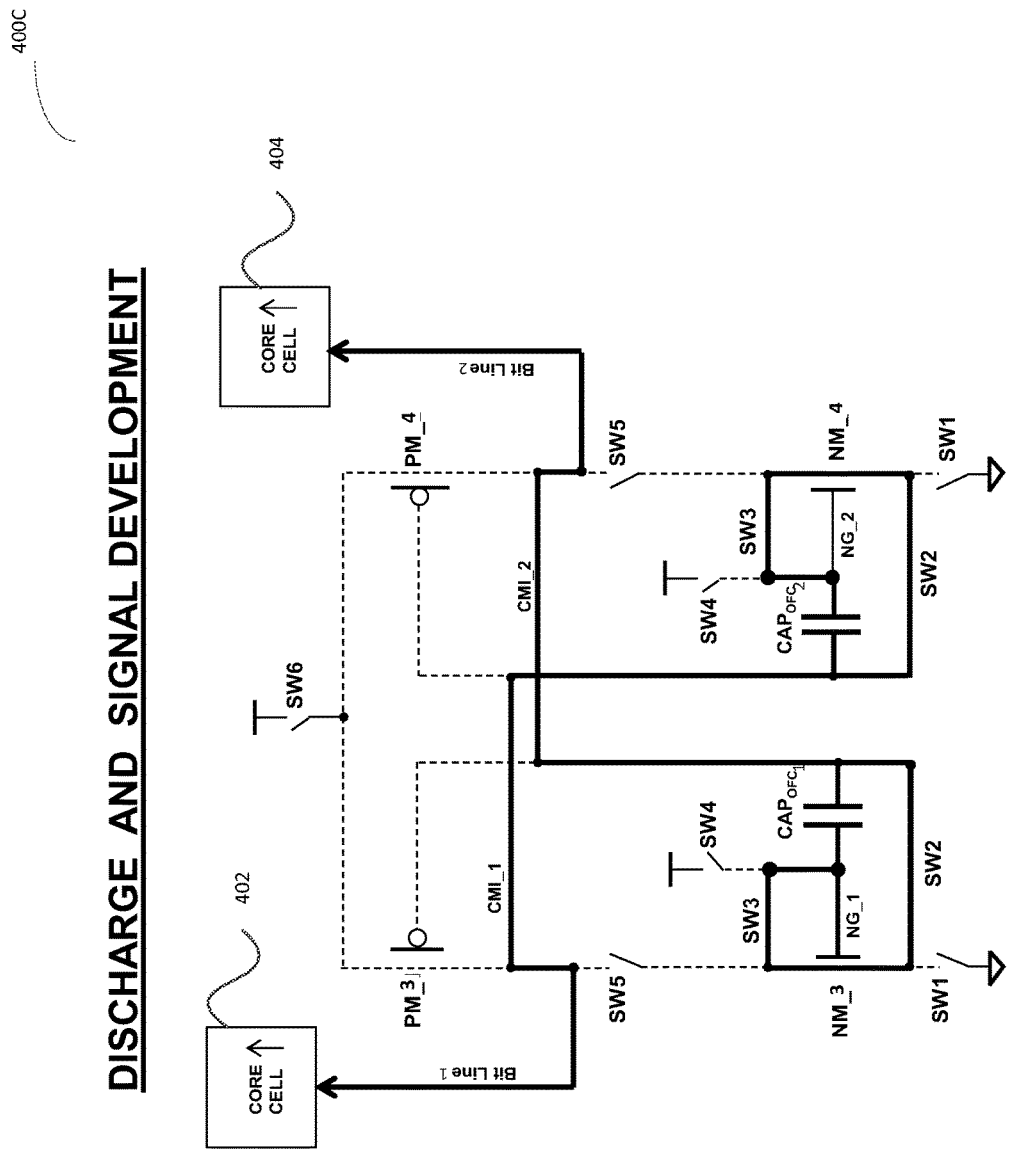

Turning to FIG. 4C and 'DICHARGE' column of FIG. 5 depicted is a sense amplifier 400C substantially similar to sense amplifier 400A, different only in the state of at least some of the switches. In this mode capacitors $CAP_{OFC1}$ and $CAP_{OFC2}$ may be discharged to NM_3 and NM_4 threshold level respectively, through the closed switches SW2, SW3 so that transistor-dependent discharging is achieved. Substantially simultaneously with the discharging of the capacitors $CAP_{OFC1}$ and $CAP_{OFC2}$, input signal development on bitline1 and bitline2 may be carried out, as well as (i) Core Cell currents charging, (ii) bit lines capacitance Charging and (iii) SA input capacitance charged all as depicted by the linear signal of graph IN. It is noted that current due to discharge of $CAP_{OFC1}$ and/or $CAP_{OFC2}$ may be substantially insignificant/negligible to bit line capacitance charging. According to some embodiments, the length (time) of the discharge stage may be determined by $CAP_{OFC1}$ or $CAP_{OFC2}$ discharge time.

Figure 4D:
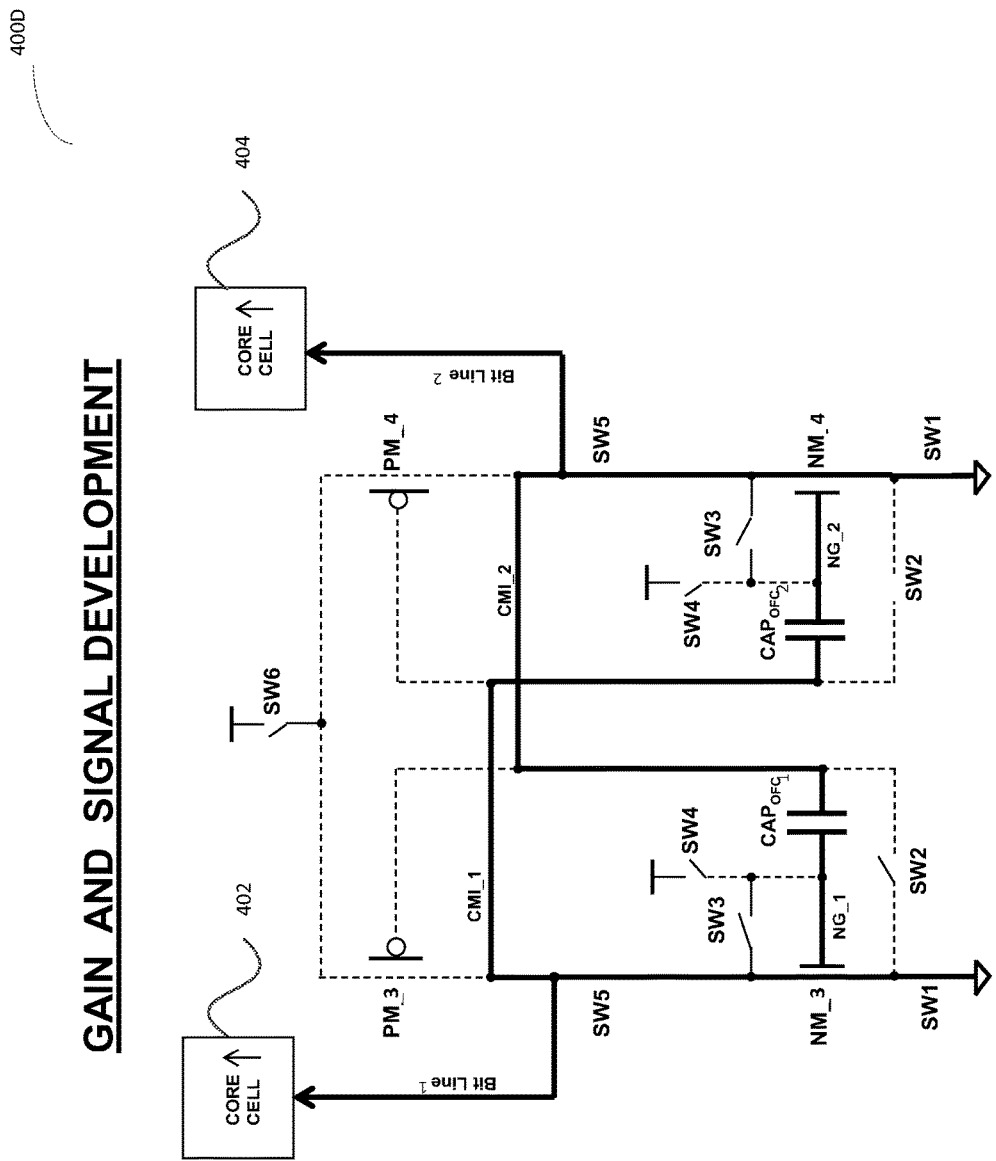

Turning to FIG. 4D and 'GAIN' column of FIG. 5 depicted is a sense amplifier 400D substantially similar to sense amplifier 400A, different only in the state of at least some of the switches. In this mode closed switches SW1, SW5 may activate offset compensated cross coupled NMOS pair (NM_3, NM_4) to amplify SA input voltages (CMI_1, CMI_2).

According to some embodiments, as depicted in FIG. 5 IN graph signal development may be continued (as shown) and may be substantially linear. The second segment (associated with the GAIN column) may be substantially continuous or different than the first segment (associated with the DISCHARGE column) so that the input voltage may be segmented-linear or have a first characterization in the discharge state and a second characterization in the gain stage.

According to some embodiments, sense amplifier 400C and 400D input capacitance may be substantially constant during discharge and gain stages since bitline1 and bitline2 may be continuously connected to $CAP_{OFC1}$ and to the relatively large PMOS transistor PM_3 and to $CAP_{OFC2}$ and to PM_4 (which is equal to PM_3)—which may aid in linear SA input signal CMI_1 and CMI_2 development/integration. The length (time) of the "GAIN" stage may be determined by sense amplifier 400D required sensitivity.

Figure 4E:
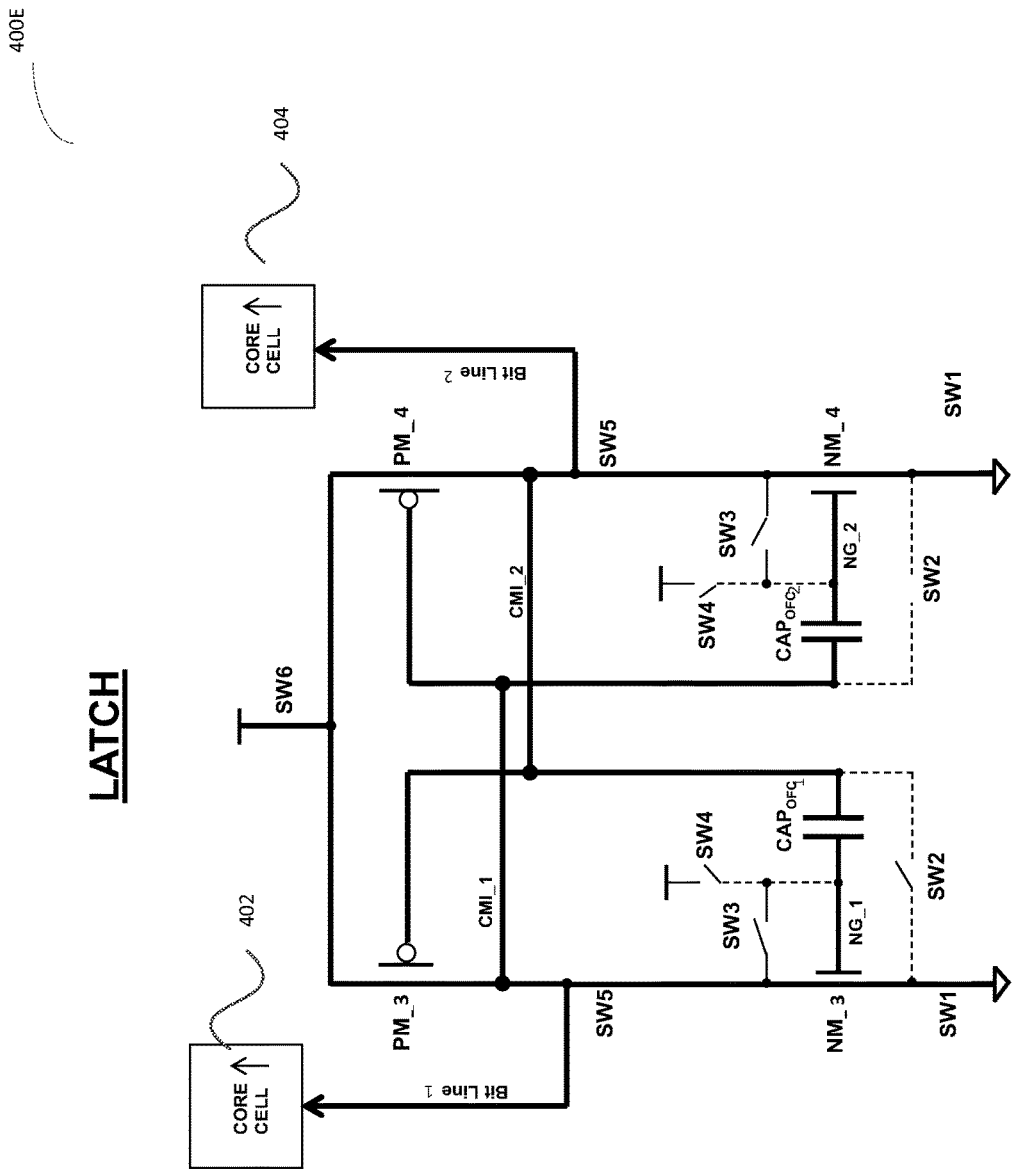

Turning to FIG. 4E and 'LATCH' column of FIG. 5 depicted is a sense amplifier 400E substantially similar to sense amplifier 400A, different only in the state of at least some of the switches. In this mode pull up switch SW6 may couple the PMOS pair (PM_3 and PM_4) to VDD and cross coupled latch flips to a digital level. Accordingly, if current of the Core Cell 402 is higher than Core Cell 404, then voltage of the node CMI_1 is coupled to VDD and voltage of the node CMI_2 is coupled to GND. Or vice versa, if current of the Core Cell 402 is lower than Core Cell 404, then voltage of the node CMI_1 is coupled to GND and voltage of the node CMI_2 is coupled to VDD and a digital output signal is achieved. Graph 5 depicts an example where CMI_1 is greater than CMI_2. The length (time) of the latch stage may be determined by length of time it takes the latching to stabilize as well as how long it takes to transfer the latches data to a subsequent data receiver.

Figure 6A:
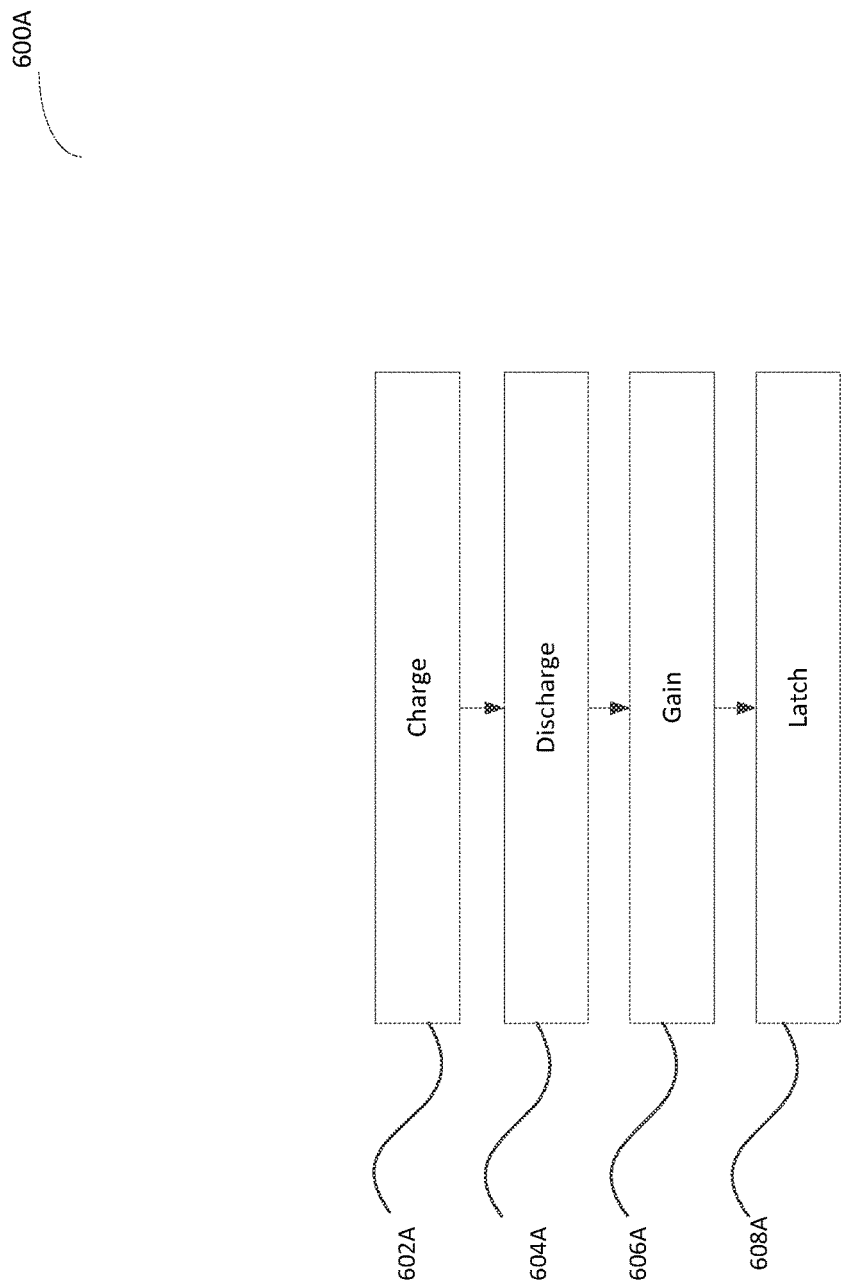
FIGS. 6A and 6B are flow charts of example methods for comparing two signals.
Figure 6B:
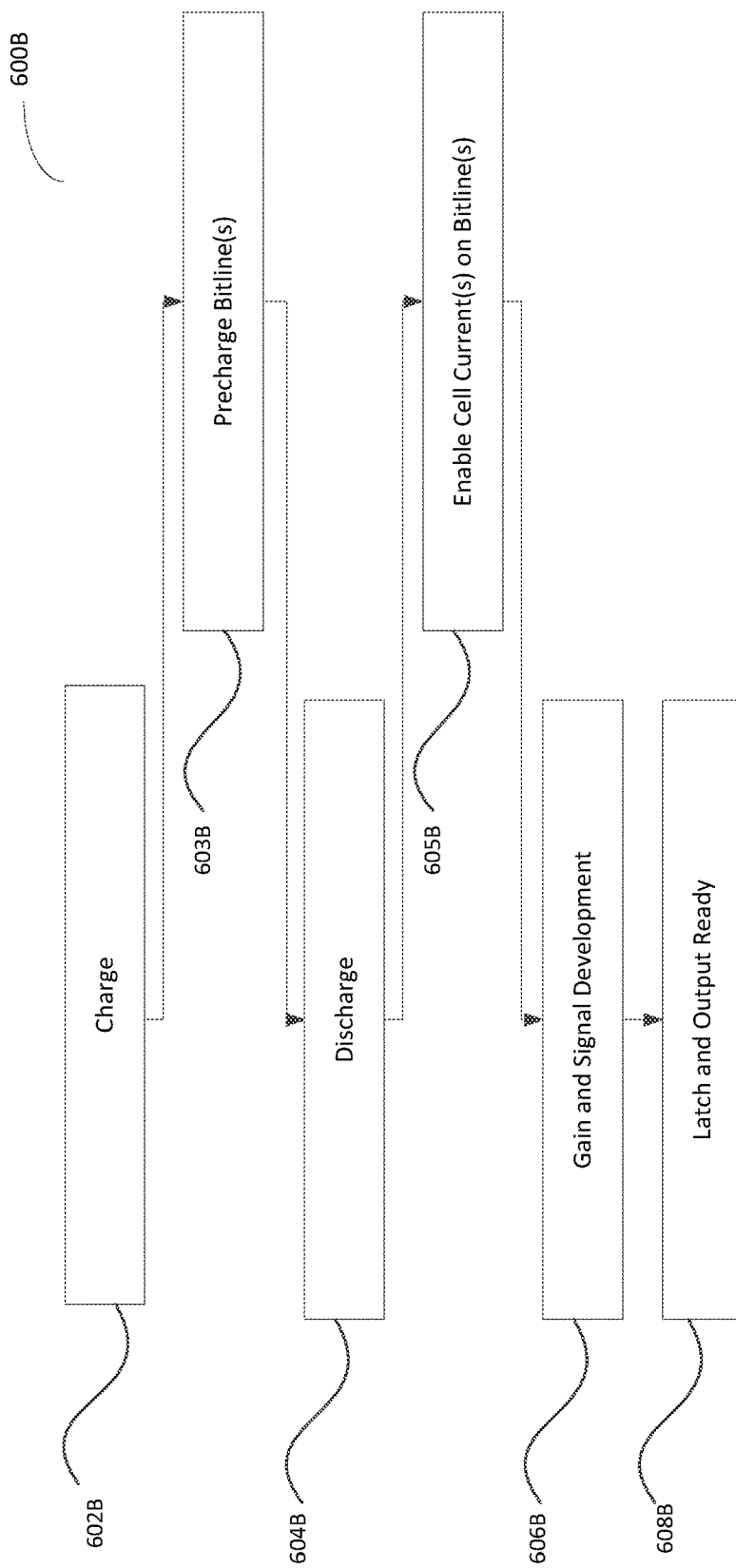

Turning to FIGS. 6A-6B depicted are flow charts of example methods for comparing two signals. FIG. 6A shows a Quadrangular sensing scheme operable on a sense amplifier such as sense amplifier 101A, as discussed with regard to FIG. 1 above. The scheme may include 4 or more steps such as: a charge step (602A) which may include-charging to a fixed voltage a compensation capacitor associated with a sense path of each of the signals. A discharge step (604A) which may include discharging each of the charged capacitors to a threshold voltage of a transistor in its respective sense path and signal development. A gain step (606A) which may include utilizing cross coupling of the first and second transistors to enable continuous first and second signal development and increased gain between the first and second input signals. A latch step (608A) which may include utilizing cross coupling to cause digital output and switches to latch.

Turning to FIG. 6B, depicted is a Quadrangular sensing scheme as discussed with regard to 6A. It is understood that steps 602B, 604B, 606B and 608B are substantially similar to steps 602A, 604A, 606A and 608A (respectively). Concurrently with charge step (602B) a bitline associated with each of the inputs may be precharged or discharged to a predetermined voltage or toward a predetermined voltage (step 603B). Concurrently with discharging each of the charged capacitors to a threshold voltage of a transistor in its respective sense path (604B) the discharge current from each capacitor may be integrated with the signal sensed on the respective sense path (step 605B). Concurrently with the gain step (606B) signal development and/or integration may be continued. Step 608B may further include latching the output until the output is received by a subsequent data receiver.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A non-volatile memory device comprising:
   at least one non-volatile memory (NVM) cell to generate a first electrical signal as a function of a programmed state of the NVM cell;
   at least one reference structure to generate a second electrical signal associated with a reference state; and
   an NVM cell reading circuit adapted to:
   (a) for each of the at least one non-volatile memory and the at least one reference structure, charge to a fixed voltage a compensation capacitor associated with a sense path of the respective signal of the two signals;
   (b) trigger a discharge into a respective sense path each of the charged capacitors to a threshold voltage of a transistor in the respective sense path; and
   (c) concurrent with the triggering of the discharge, integrating with the discharge current from each capacitor a respective signal sensed on the respective sense path.

2. The device according to claim 1, wherein said circuit further includes a cross coupled latch to increase a gain between the two signals.

3. The device according to claim 2, further wherein said circuit is further adapted to latch the respective signals to create a substantially digital output.

4. The device according to claim 2, wherein the respective signals sensed on the respective sense path develop substantially continuously.

5. The device according to claim 4, wherein the respective signals sensed develop substantially linearly.

6. The device according to claim 3, wherein the circuit includes a group of switches switched to a first charging state to enable said charging and switched to a second discharging state to enable said discharging.

7. The device according to claim 6, wherein said circuit is further adapted to switch the group of switches to increase said gain and switching the group of switches to enable said latching.

8. A non-volatile memory device comprising:
   a non-volatile memory (NVM) cell to generate a first signal as a function of a programmed state of the NVM cell;
   a reference structure to generate a second signal; and
   a reading circuit including a first compensation capacitor coupled to a first transistor in a first sense path for the first signal, and a second compensation capacitor coupled to a second transistor in a second sense path for the second signal,
   wherein the reading circuit is adapted to charge the first and second compensation capacitors, and discharge the first compensation capacitor to a threshold voltage of the first transistor, and discharge the second compensation capacitor to a threshold voltage of the second transistor, while concurrently integrating the first and second signals with the discharge currents of the first and second compensation capacitors.

9. The device according to claim 8, wherein said reading circuit further includes a cross coupled latch to increase a gain between the first and second signals.

10. The device according to claim 9, further wherein said reading circuit is further adapted to latch the first and second signals to create a substantially digital output.

11. The device according to claim 9, wherein the first and second signals sensed on the first and second sense paths develop substantially continuously.

12. The device according to claim 11, wherein the first and second signals sensed on the first and second sense paths develop substantially linearly.

13. A sense amplifier comprising:
a first branch coupled to a non-volatile memory (NVM) cell and configured to receive a first signal that is a function of a programmed state of the NVM cell; and
a second branch coupled to a reference structure and configured to receive a second signal,
wherein each of the first and second branches comprises a compensation capacitor and a switching module, and wherein the switching module is adapted to charge the compensation capacitor, and to discharge the compensation capacitor to a threshold voltage of a transistor in the respective branch while concurrently receiving and integrating a discharge current of the compensation capacitor with one of the respective first or second signals using the transistor.

14. The sense amplifier according to claim 13, further comprising a cross coupled latch between the first and second branches to increase a gain between the first and second signals.

15. The sense amplifier according to claim 14, wherein said switching modules of said first and second branches is further adapted to latch the first and second signals to create a substantially digital output.

16. The sense amplifier according to claim 14, wherein the sense amplifier is adapted to enable the first and second signals received by the first and second branches to develop substantially continuously.

17. The sense amplifier according to claim 16, wherein the sense amplifier is further adapted to enable the first and second signals received by the first and second branches to develop substantially linearly.

* * * * *